United States Patent [19]
Lazaroff

[11] Patent Number: 5,581,049
[45] Date of Patent: Dec. 3, 1996

[54] EXPANDING JOINT FOR AN INITIALLY SUBSTANTIALLY PLANAR MEMBER

[75] Inventor: David I. Lazaroff, Somerville, Mass.

[73] Assignee: Orion Industries Incorporated, Ayer, Mass.

[21] Appl. No.: 227,008

[22] Filed: Apr. 13, 1994

[51] Int. Cl.$^6$ .................................................. H05K 9/00
[52] U.S. Cl. .................... 174/35 R; 220/DIG. 21; 206/275
[58] Field of Search ..................... 174/35 R, 35 MS, 174/35 GC, 50; 206/145, 147, 152, 170, 275, 320, 328, 329, 332, 461, 462, 517; 220/6, 7, 666, DIG. 21; 331/67; 334/85; 361/816, 818

[56] References Cited

U.S. PATENT DOCUMENTS

| | | | |
|---|---|---|---|
| 2,307,076 | 1/1943 | Ray | 93/3 |
| 3,006,527 | 10/1961 | Lofquist, Jr. | 229/22 |
| 3,281,058 | 10/1966 | Buttery | 229/145 |
| 3,917,900 | 11/1975 | Arnaudin, Jr. | 174/36 |
| 4,019,675 | 4/1977 | Andersson et al. | 229/31 |
| 4,312,451 | 1/1982 | Forbes, Jr. | 206/628 |
| 4,370,515 | 1/1983 | Donaldson | 174/35 R |
| 4,765,534 | 8/1988 | Zion et al. | 229/109 |
| 4,845,310 | 7/1989 | Postupack | 174/35 R |
| 4,901,911 | 2/1990 | Drexhage | 229/114 |
| 4,951,868 | 8/1990 | Mode | 229/112 |
| 4,980,223 | 12/1990 | Nakano et al. | 428/198 |
| 5,028,490 | 7/1991 | Koskenmaki et al. | 428/594 |
| 5,397,966 | 3/1995 | Vrionis et al. | 315/248 |

*Primary Examiner*—Bot L. Ledynh
*Attorney, Agent, or Firm*—Hamilton, Brook, Smith & Reynolds, P.C.

[57] ABSTRACT

An expanding joint is disclosed for increasing the size of an initially substantially planar member, upon stretching. The joint includes a discontinuous incision having a sinusoidal pattern extending transversely on an axis extending normal to the direction of stretching and being arranged in alternating concave and convex portions. Each of the concave and convex portions are discretely separated from the portions by an isthmus such that the incision widens upon application of tension in a direction substantially normal to the axis.

7 Claims, 4 Drawing Sheets

5,581,049

EXPANDING JOINT FOR AN INITIALLY SUBSTANTIALLY PLANAR MEMBER

BACKGROUND OF THE INVENTION

Electronic devices, such as computers, televisions, portable phones and the like, while operating, have components that can emit an electromagnetic radiation field which can interfere with the operation of other electronic components contained in the electronic device. Further, excessive electromagnetic radiation can be harmful to humans. For instance, with portable cellular phones, there have been recent health concerns about the amount of electromagnetic radiation emitted by the phones while they are held close to the head and the possible harm to the operator.

In order to minimize the exposure of electromagnetic radiation to the other electronic components and also to humans, which is required by government regulations, various types of shielding are placed around the electronic components to prevent exposure to this radiation. One problem is that the shielding, which must essentially cover the complete component in order to block the electromagnetic radiation, can be bulky. This bulkiness can be detrimental to electronic apparatus that require compact sizes, such as hand-held portable cellular phones, where the spacing between individual components within a device have very close tolerances that require a thin but effective shield. However, if the device has a contouring surface that changes continuously or discretely, the shielding needs to be cut and taped with metal foil or a second piece of shielding needs to be inserted over the opening which can possibly leak electromagnetic radiation. This requires additional labor and material that can increase the cost.

Therefore, a need exists for an expanding joint for an initially substantially planar member, such as for electromagnetic interference shielding, to allow the formation a form fitting shield which can overcome some of the above-referenced problems.

SUMMARY OF THE INVENTION

The present invention relates to an expanding joint for increasing the size of an initially substantially planar member upon stretching. The joint includes a discontinuous incision having a sinusoidal pattern extending transversely on an axis extending normal to the direction of stretching and being arranged in alternating concave and convex portions. Each of the portions are discretely separated from the portions by an isthmus such that the incision widens upon application of tension in a direction substantially normal to the axis.

This invention has a number of advantages. One advantage is that the expanding joint is easy to produce from one sheet of shielding. The tooling costs for forming this expanding joint are low. Electromagnetic interference shielding having the expanding joint can be easily installed and placed around the corners of an electronic component. Also, the joint allows access for a connector or cable through the expanding joint.

DETAILED DESCRIPTION OF THE INVENTION

The features and other details of the method and apparatus of the invention will now be more particularly described to the accompanying drawings and pointed out in the claims. The same numeral in different figures represent the same item. It will be understood that the particular embodiments of the invention are shown by way of illustration and not as limitations of the invention. The principle features of this invention can be employed in various embodiments without departing from the scope of the invention.

Figure 1:
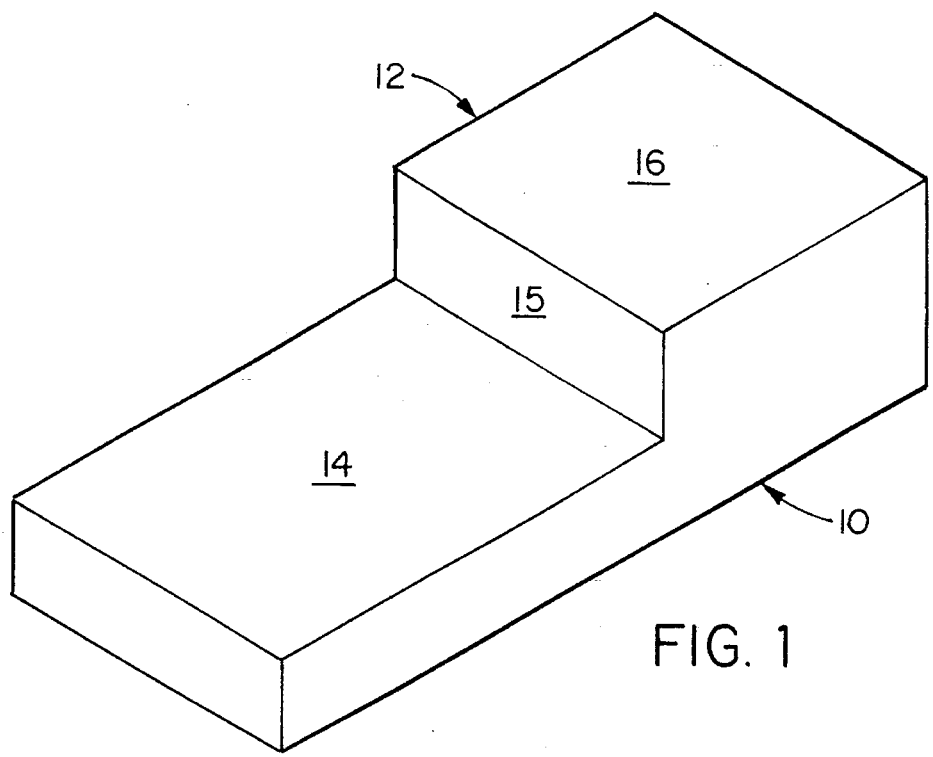
FIG. 1 is a perspective view of a shape of an electronic component having a side with two distinct levels.

The present invention relates to an expanding joint for increasing the size of an initially substantially planar member, such a blank that forms a continuous sheet enclosure that folds into a box that is an electrically self-sealing electromagnetic interference shield. An example of a suitable blank for forming a suitable interference shield is disclosed in U.S. patent application Ser. No. 08/191,799, entitled "An Electromagnetic Interference Shield" by David I. Lazaroff, filed Feb. 3, 1994, the teachings of which are herein incorporated by reference. As shown in FIG. 1, electronic component 10 has side 12 having first level 14 that is joined by face 15 to second level 16. In one embodiment, first level 14 can be a circuit board while second level 16 can be transistors, capacitors or other electronic devices that extend form the circuit board of first level 14. Without the expanding joint of this invention, such a configuration can require cutting and taping or insertion of a second piece of shielding to position the shield in close proximity to the electronic component along first level 14, face 15 and second level 16.

The electromagnetic interference shield blank is made from a sheet that is sufficiently thick when folded about an electronic component that it provides sufficient shielding to the operator of an electronic device or the adjacent electronic components, or both. Also, the blank can have sections cut out to allow a portion of the electronic component to pass through. For example, a wire can extend from the component to another part of the electronic device. Preferably, the cut section has openings that are smaller in width than the wavelength of the radio interference generated by the electronic component. Also, the corners of the blank can be cut out to allow the blank to be more easily folded. The blank can be formed of a laminated sheet having an electrically insulating layer and a conductive layer. Alternatively, the blank is formed of only an insulating layer. The insulating layer is formed of a polymer that has electrically insulative properties. For instance, suitable polymers are selected from a group of polyester, polybutylene teraphthalate, polyvinyl chloride, polyethylene, polypropylene, and polyamide. In one embodiment, the insulative layer has a thickness in the range of between about 0.002 and 0.010 inches. In an preferred embodiment, the insulating layer has a thickness in the range of between about 0.002 and 0.005 inches. The laminate can be formed with a conductive layer on the insulating layer. The conductive layer can be comprised of an electrically conductive metal. This includes metals selected from the group of copper, tin, aluminum and iron. In one embodiment, the conductive layer has a thickness in the range of between about 0.001 and 0.003 inches. The conductive layer forms the outer layer of the shield.

The insulative layer and the conductive layer can be joined by a suitable adhesive. An example of a suitable adhesive includes an acrylic. In one embodiment, the thickness of the adhesive layer is about 0.002 inches.

Figure 2:
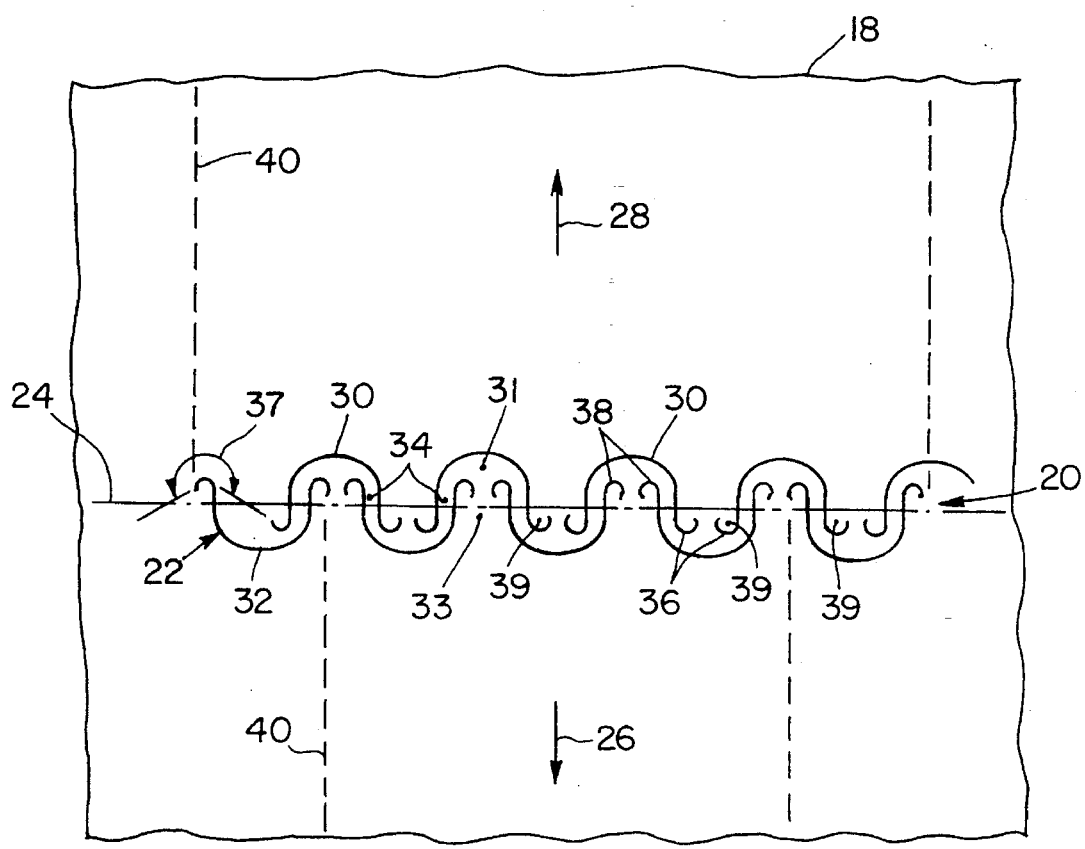
FIG. 2 is a plan view of an expanding joint while having no tension applied for a shield made from a blank for forming a shield around the shape of the electronic component of FIG. 1.

Expanding joint 20 is shown in FIG. 2 on a portion of blank 18 having a conductive layer and an insulative layer for forming an uncut continuous sheet enclosure that folds into a box that is an electrically self-sealing electromagnetic interference shield. Joint 20 includes discontinuous incision 22 that extends through the sheet and has a sinusoidal pattern extending transversely on axis 24 which extends normal to directions 26, 28 of applied tension. Incision 22 is arranged in alternating concave portions 30 and convex portions 32. Joint 20 has a plurality of concave portions 30 and convex portions 32 each which form head area 31 and stem area 33. In one embodiment, joint 20 has four concave portions about a centimeter wide and one centimeter high and four convex portions 32 having the same dimensions as the concave portions. Each concave portion 30 and convex portion 32 are separated by isthmuses 34. In another embodiment, each isthmus 34 has a width of about 0.2 centimeters and a length of about 0.6 centimeters.

Concave portions 30 and convex portions 32 can have comparatively small convex extensions 36 and concave extensions 38, respectively, for each incision for providing stress relief upon the application of tension in directions 26, 28 that are substantially normal to axis 24. Preferably, convex and concave extensions 36, 38 form arcs 37 of greater than about 180° to form knobs 39.

Incision 22 can be formed by methods known in the art, such as by cutting with a die having the same configuration. Concave and convex portions 30, 32 can also be arranged in an increasing or decreasing size along axis 24. Blank 18 is cut and scored along lines 40 to provide for folding. In one embodiment, scored lines 40 are perforations.

Figure 3A:
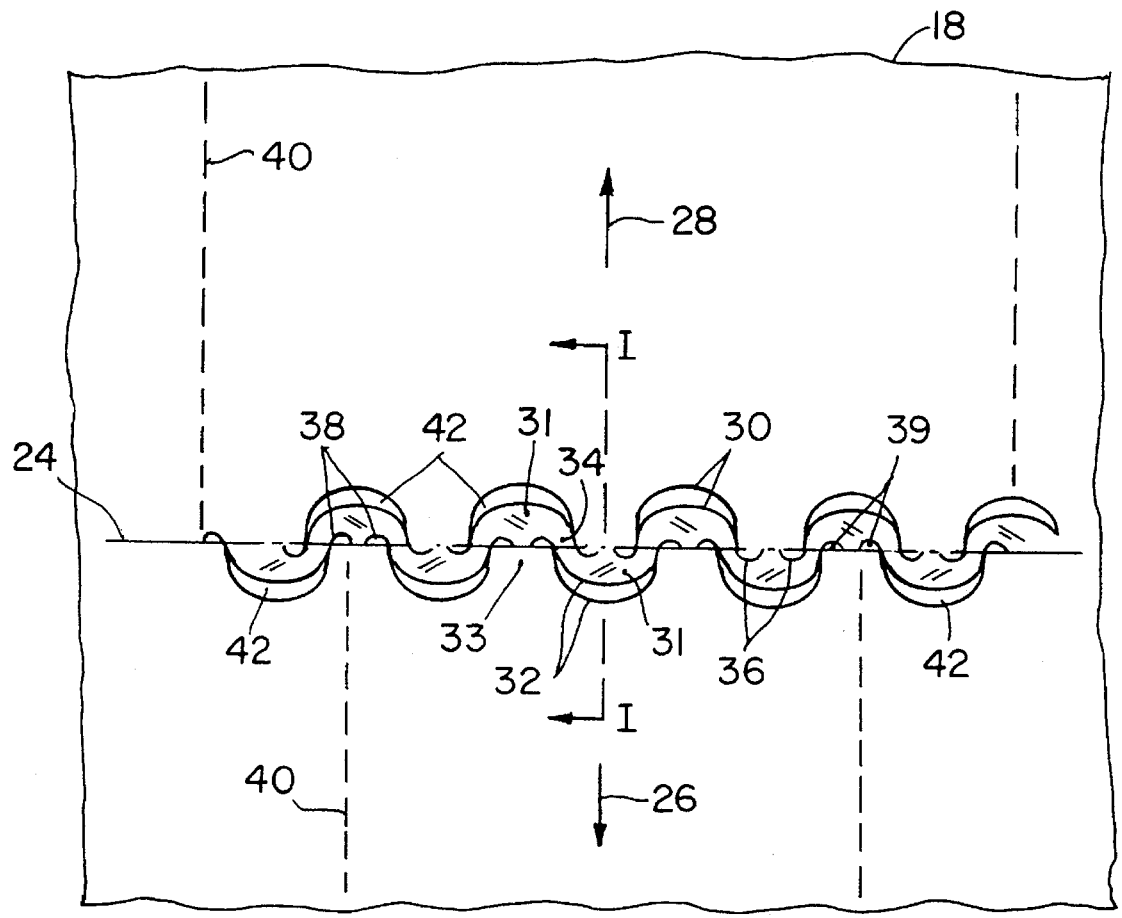
FIG. 3A is a plan view of the same expanding joint for a shield as shown in FIG. 2 but which has tension applied to the joint.
Figure 3B:
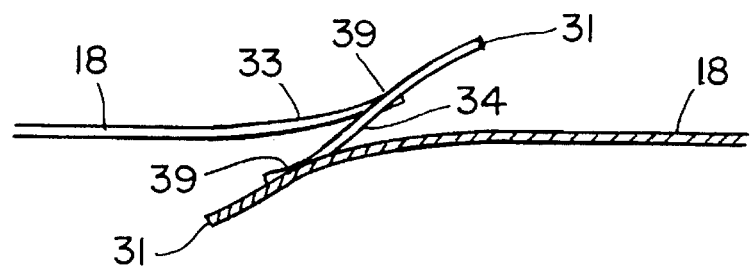
FIG. 3B is a side view of the expanding joint for a shield as shown in FIG. 3A along line I—I.

As shown in FIG. 3A, a significant amount of tension is applied to joint 20 in directions 26, 28 to cause discontinuous incision 22 to separate to form voids 42. FIG. 3B shows an end view of FIG. 3A along line I—I. In one embodiment, upon applying tension to joint 20 concave and convex portions 30, 32 are forced out of the same plane that blank 18 essentially lies in so that concave portions 30 are above and convex portions 32 are below the plane of blank 18 in an alternating manner.

Figure 4A:
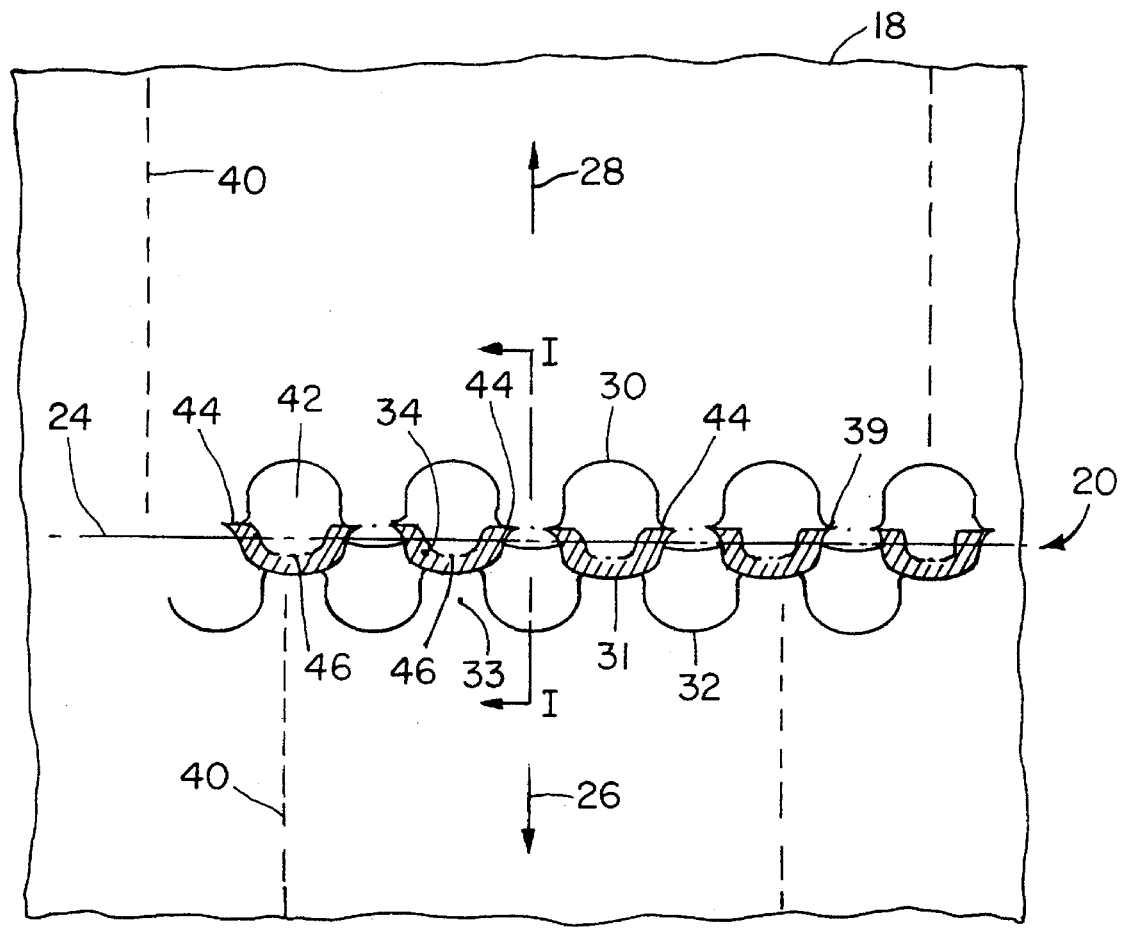
FIG. 4A is a plan view of the same expanding joint for a shield as shown in FIG. 2 but which has more tension applied to the joint than the one displayed in FIG. 3A.
Figure 4B:
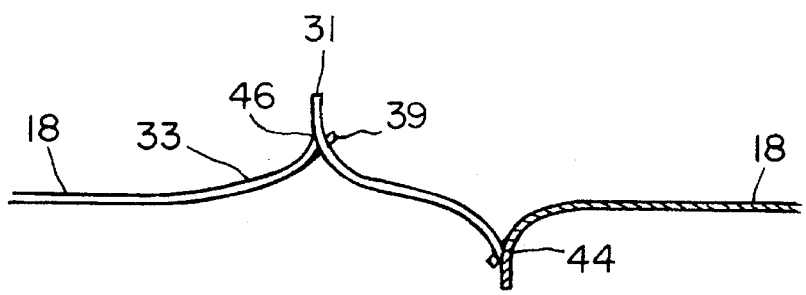
FIG. 4B is a side view of the expanding joint for a shield as shown in FIG. 4A along line I—I.

In FIG. 4A, a significantly greater amount of tension than as applied in FIGS. 3A and 3B, is applied to joint 20 in directions 26, 28 to cause discontinuous incision 20 to separate further. Isthmuses 34 have a sufficient amount of tension applied to cause isthmuses 34 to fold about isthmus fold 44 and about a portion of head area 31 at head fold 46, thereby exposing the other side of isthmus 34. In FIG. 4B, an end view along line I—I discloses the separation upon further application of tension in directions 26, 28.

Figure 5:
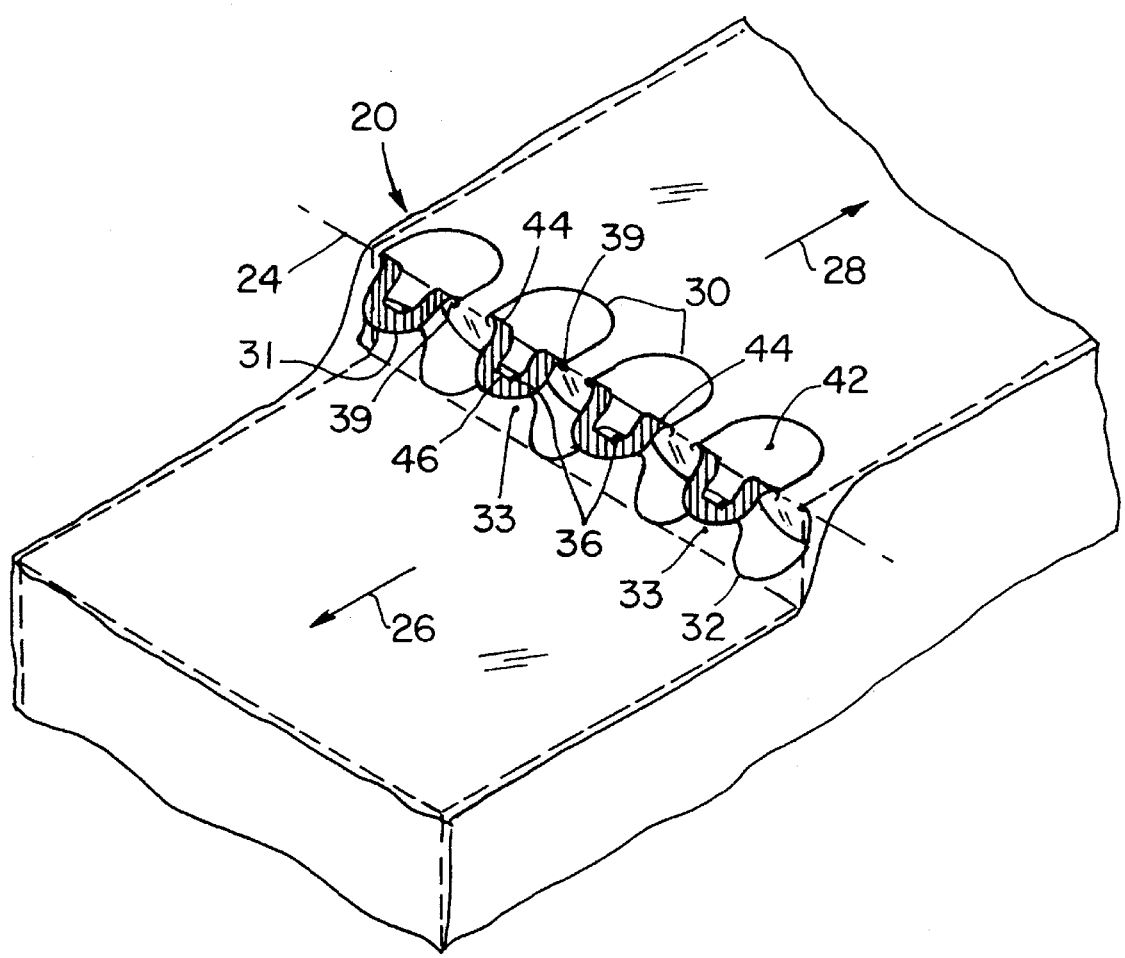
FIG. 5 is a perspective view of a fully tensioned and folded shield having the expanding joint shown in FIG. 2.

In FIG. 5, a perspective view is shown of sheeting forming an electromagnetic interference shield with expanding joint 20 about electronic component 10 as shown in FIG. 1.

The expanding joint of the present invention is not limited to electromagnetic interference shielding but is suitable for various coverings that have a multilevel surface.

Equivalents

Those skilled in the art will recognize, or be able to ascertain using no more than routine experimentation, many equivalents to specific embodiments of the invention described specifically herein. Such equivalents are intended to be encompassed in the scope of the following claims.

I claim:

1. An expanding joint in an electromagnetic interference shield for an electronic component for increasing the size of an initially substantially planar member upon stretching which comprises a discontinuous incision having a sinusoidal pattern extending transversely on an axis extending normal to the direction of stretching and being arranged in alternating concave and convex portions, wherein each end of said concave portions having convex extensions extending therefrom and each end of said convex portions having concave extensions extending therefrom and wherein each of said portions being discretely separated from said portions by an isthmus such that said incision widens upon application of tension in a direction substantially normal to said axis and said incisions are smaller than the wavelength of the electromagnetic interference emitted from the electronic component.

2. The expanding joint of claim 1 wherein said concave and convex incisions are proportionally increasing in size along said axis.

3. The expanding joint of claim 2 wherein the joint is formed of a laminated sheet having an insulating layer and a conductive layer.

4. The expanding joint of claim 3 wherein the insulating layer is formed of an insulative polymer.

5. The expanding joint of claim 4 wherein the conductive layer is comprised of a conductive metal.

6. The expanding joint of claim 5 wherein the insulative layer and the conductive layer are joined by an adhesive.

7. An expanding joint for increasing the size of an initially substantially planar member upon applying tension which comprises a series of incisions having a sinusoidal pattern extending transversely on an axis extending normal to the direction of tension and being arranged in alternating concave and convex portions, wherein each of said concave portions having convex extensions extending therefrom and each of said convex portions having concave extensions extending therefrom and each of said portions being discretely separated by an isthmus such that said incisions widen upon application of tension in a direction substantially normal to said axis.

* * * * *